United States Patent [19]

Kujiraoka et al.

[11] Patent Number: 4,938,923

[45] Date of Patent: Jul. 3, 1990

[54] GOLD WIRE FOR THE BONDING OF A SEMICONDUCTOR DEVICE

[76] Inventors: Takeshi Kujiraoka; Koichiro Mukoyama; Hiromi Yamamoto; Kenichi Kurihara, all of c/o Tanaka Denshi Kogyo Kabushiki Kaisha, 6-6, Nihonbashi Kayaba-cho, 2-chome, Chuoh-ku, Tokyo, Japan

[21] Appl. No.: 429,485

[22] Filed: Oct. 31, 1989

[30] Foreign Application Priority Data

| Apr. 28, 1989 | [JP] | Japan | 1-109447 |
| Apr. 28, 1989 | [JP] | Japan | 1-109448 |
| Apr. 28, 1989 | [JP] | Japan | 1-109449 |
| Apr. 28, 1989 | [JP] | Japan | 1-109450 |

[51] Int. Cl.$^5$ ............................................. C22C 5/02
[52] U.S. Cl. ............................. 420/509; 420/507; 420/508; 420/510; 420/511; 420/512; 428/606
[58] Field of Search ............... 420/507, 508, 509, 510, 420/511, 512; 428/606

[56] References Cited

U.S. PATENT DOCUMENTS

| 3,272,625 | 9/1966 | Brenner | 420/507 |
| 4,080,485 | 3/1978 | Bonkohara | 420/507 |
| 4,330,329 | 5/1982 | Hayashi et al. | 420/511 |
| 4,752,442 | 6/1988 | Asada et al. | 420/507 |
| 4,775,512 | 10/1988 | Fukui et al. | 420/507 |

FOREIGN PATENT DOCUMENTS

| 105968 | 9/1978 | Japan | 420/507 |
| 13740 | 2/1981 | Japan | 420/508 |
| 30731 | 3/1981 | Japan | 420/507 |
| 96844 | 8/1981 | Japan | 420/512 |
| 122140 | 9/1981 | Japan | 420/511 |
| 90952 | 6/1982 | Japan | 420/507 |
| 16041 | 1/1983 | Japan | 420/507 |
| 96741 | 6/1983 | Japan | 420/507 |
| 60-30158 | 2/1985 | Japan . | |
| 220343 | 9/1986 | Japan | 420/507 |
| 228440 | 10/1987 | Japan . | |
| 290835 | 12/1987 | Japan . | |
| 243238 | 10/1988 | Japan . | |
| 4441 | 1/1989 | Japan . | |
| 127635 | 5/1989 | Japan . | |

*Primary Examiner*—Robert McDowell
*Attorney, Agent, or Firm*—Sandler, Greenblum & Bernstein

[57] ABSTRACT

The gold wire used for the wire bonding of a semiconductor device comprises at least three kinds of elements selected from rare earth elements such as La, Ce and Pr: Be, Ca, Mg, Ag, Fe: and platinum group elements; and the balance of Au at high purity.

6 Claims, No Drawings

GOLD WIRE FOR THE BONDING OF A SEMICONDUCTOR DEVICE

BACKGROUND OF THE INVENTION

1. Field of the Invention

The present invention concerns a gold wire for wire bonding used for connecting chip electrodes and external leads of a semiconductor.

2. Description of the Prior Art

For improving mechanical property and bonding property of gold wires for bonding, various kind of elements have been incorporated into Au at high purity of 99.99% or higher.

For instance, there have been known those bonding wires prepared by incorporating La, Pb, Be and Ca to Au at high purity (Japanese Patent Laid-Open Sho No. 62-228440), or a predetermined amount of La and Be to Au at high purity (Japanese Patent Laid-Open Sho No. 60-30158) and they have respective usefulness under certain conditions.

However, as the multi-pin arrangement has been adopted more and more in LSI packages in recent years, it has been required that wire loops in the form of bonding have greater length and height of loops as compared with conventional loops.

That is, it has been required that a loop height be maintained without causing sagging of the loop and that even a long loop has a property of not causing sweep, that is, high tensile strength at a ball neck portion (neck strength), large loop height and less wire bending.

In conventional gold wires, however, the foregoing requirements can not be satisfactorily achieved with known additive elements and the range of the content thereof and, accordingly, no improvement can be expected for the reliability of semiconductor devices.

SUMMARY OF THE INVENTION

In view of the foregoing disadvantages associated with the prior art, the object of the present invention is to provide a gold wire of a bonding capable of satisfying the requirement for long and high loop, while being capable of ensuring high reliability of semiconductor devices.

The foregoing object can be attained by a gold wire for bonding of the first through fourth embodiments of the present invention.

The gold wire for bonding of the first embodiment according to the present invention comprises 30 to 100 wt ppm of La, 2 to 10 wt ppm of Be, 1 to 20 wt ppm of Ca and 1 to 10 wt ppm of Mg, and the balance of Au at high purity.

The gold wire for bonding of the second embodiment according to the present invention comprises from 1 to 20 wt ppm of Ca. 1 to 10 wt ppm of Mg and 1 to 90 wt ppm of one or more of rare earth elements, and the balance of Au at high purity.

The gold wire for bonding of the third embodiment according to the present invention comprises 30 to 200 wt ppm of La, 1 to 20 wt ppm of Be, 1 to 20 wt ppm of Ca and 1 to 60 wt ppm of one or more of platinum group elements and the balance of Au at high purity.

The gold wire for bonding of the fourth embodiment according to the present invention comprises 30 to 100 wt ppm of La, 0.5 to 30 wt ppm of Be, 1 to 20 wt ppm of Ca and 0.5 to 50 wt ppm of Mg, 2 to 80 wt ppm of Ag, 0.5 to 50 wt ppm of Fe, and the balance of Au at high purity.

In each of the above-mentioned embodiments, Au used as the starting material has a purity of 99.99% or more including inevitable impurity.

DESCRIPTION OF THE PREFERRED EMBODIMENTS

The first embodiment for the Au wire according to the present invention comprises from 30 to 100 wt ppm of La, 2 to 10 wt ppm of Be, 1 to 20 wt ppm of Ca and 1 to 10 wt ppm of Mg and the balance of Au at high purity.

In the first embodiment, La, Be, Ca and Mg have the following functions.

La has a function of increasing tensile strength of a gold wire at high temperature (high temperature strength), promoting the refining of crystal grains upon forming a ball, suppressing sweep in a long loop and suppressing the wire flow upon resin molding. If the content is less than 30 wt ppm, the foregoing functions can not be satisfied.

On the contrary, if the La content exceeds 100 wt ppm, joining strength after bonding is reduced, as well as the ball hardness is increased to cause chip cracking upon bonding.

Be has a function of increasing tensile strength of the gold wire under normal temperature, as well as refining the crystal grain size upon ball-formation of the gold wire and suppressing sweep in the long loop like that for La. If the content is less than 2 wt ppm, no desired function can be obtained.

On the other hand, if the Be content exceeds 10 wt ppm, joining strength is reduced, and neck disconnection or chip cracking is caused upon bonding.

Ca has a function of particularly improving high temperature strength of the gold wire, increasing tensile strength at normal temperature, suppressing aging change, as well as promoting the refining of crystal grains upon ball formation and suppressing wire flow upon resin molding. If the content is less than 1 wt ppm, the foregoing functions can not be obtained.

On the contrary, if Ca content exceeds 20 wt ppm, joining strength is reduced, as well as neck disconnection or chip cracking is caused and abnormality in the shape of the loop such as sagging may occur frequently.

Mg has a function of improving tensile strength at normal temperature and high temperature strength of gold wire, suppressing aging change, as well as suppressing sweep in the long loop and suppressing wire flow upon resin molding. If the content is less than 1 wt ppm the foregoing functions can not be obtained.

On the contrary, if Mg content exceeds 10 wt ppm, joining strength is reduced, as well as the ball shape (sphericalness) is not stable and chip cracking is caused upon bonding.

Explanation will be made for examples of the first embodiment, as follows.

Each of the specimens was prepared by melting and casting high purity Au (99.999%) with addition of La, Be, Ca and Mg, applying fabrication by a grooved roll, in which annealing was applied in the course of the fabrication, and then applying wire drawing to form an extremely fine gold wire of 25 μmφ.

The contents of elements in each of the specimens are as shown in Table 1. Specimens Nos. 1–4 are examples of the present invention, while specimens Nos. 5–7 are comparative examples out of the range of the composition according to the present invention.

| Specimen No. | Additive element (wt ppm) | | | | |
|---|---|---|---|---|---|
| | Au | La | Be | Ca | Mg | Pb |
| Example | | | | | | |
| 1 | balance | 30 | 2 | 1 | 1 | |
| 2 | " | 50 | 10 | 1 | 1 | |
| 3 | " | 50 | 5 | 10 | 15 | |
| 4 | " | 100 | 10 | 20 | 10 | |
| Comparative example | | | | | | |
| 5 | " | 25 | 1 | 1 | 1 | |
| 6 | " | 110 | 15 | 25 | 25 | |
| 7 | " | 30 | 10 | 7 | | 30 |

Results for the measurement of mechanical properties and bonding properties for the above-mentioned specimens are shown in the following Table (2).

TABLE 2

| Specimen No. | Mechanical property | | | | Bonding test | | | | |
|---|---|---|---|---|---|---|---|---|---|
| | Normal temperature | | High temperature (250° C. 2S) | | | Tensile strength | Neck strength | Loop height | sweep |
| | B.L(g) | El (%) | B.L(g) | El (%) | Ball shape | (g) | (g) | ($\mu$m) | (%) |
| Example 1 | 11.3 | 5.2 | 8.5 | 1.6 | excellent | 8.1 | 8.5 | 193 | 2.5 |
| 2 | 11.9 | 4.0 | 8.6 | 1.7 | " | 8.3 | 8.9 | 205 | 2.1 |
| 3 | 12.1 | 4.0 | 9.1 | 1.5 | " | 8.6 | 9.4 | 198 | 2.3 |
| 4 | 12.5 | 4.2 | 9.4 | 1.2 | " | 8.8 | 10.0 | 194 | 2.6 |
| Comparative 5 | 10.8 | 4.0 | 7.9 | 1.8 | " | 7.1 | 7.6 | 190 | 2.8 |
| Example 6 | 13.0 | 4.0 | 9.6 | 1.0 | good | 9.0 | 10.4 | 172 | 3.8 |
| 7 | 11.0 | 4.0 | 8.1 | 1.1 | excellent | 8.0 | 8.6 | 188 | 2.7 |

From the results of the measurement, it can be seen that the composition of the present invention is best within the range described above.

The Au wire of the second embodiment of the present invention comprises 1 to 20 wt ppm of Ca, 1 to 10 wt ppm of Mg and 1 to 90 wt ppm of one or more of rare earth elements and the balance of Au at high purity.

In the Au alloy of the second embodiment, the additive element: Ca, Mg and rare earth elements have the following functions.

Ca has a function of particularly improving high temperature strength of the gold wire, increasing tensile strength at normal temperature, suppressing aging change, as well as promoting refining of crystal grains upon ball formation and suppressing wire flow upon resin molding. If the content is less than 1 wt ppm, the foregoing functions can not be obtained.

On the contrary, if Ca content exceeds 20 wt ppm, joining strength is reduced, as well as neck disconnection or chip cracking is caused and abnormality in the shape of the loop, such as sagging, may occur frequently.

Mg has a function of improving tensile strength at normal temperature and improving high temperature strength of the gold wire, suppressing aging change, as well as suppressing sweep in a long loop and suppressing wire flow upon resin molding. If the content is less than 1 wt ppm, the foregoing functions can not be obtained.

On the contrary, if the Mg content exceeds 10 wt ppm, joining strength is reduced, and the ball shape (sphericalness) is not stable and chip cracking is caused upon bonding.

The rare earth elements comprise La, Ce, Pr, Nd, Sm, etc. having atom numbers from 50 to 71, and they have a function, in cooperation with Ca and Mg, of increasing high temperature strength, promoting refining of crystal grains upon ball formation, suppressing sweep for long loop, as well as suppressing wire flow upon resin molding. If the content is less than 30 wt ppm, the foregoing function can not be satisfied.

On the contrary, if the rare earth element exceeds 100 wt ppm, joining strength after bonding is reduced and bonding hardness is increased to cause chip cracking upon bonding.

Explanation will be made to examples of the second embodiment, as follows.

Each of the specimens was prepared by melting and casting high purity Au (99.999%) with addition of Ca, Mg and one or more of La, Ce and Pr of rare earth elements, applying fabrication with grooved roll, in which annealing was applied in the course of the fabrication, and then applying wire drawing to form an extremely fine gold wire of 25 $\mu$m$\phi$.

The contents of elements in each of the specimens are as shown in Table 3. Specimens Nos. 1–7 are examples of the present invention, while specimens No. 8–11 are comparative examples out of the range of the composition according to the present invention.

TABLE 3

| Specimen No. | Au | Additive element (wt ppm) | | | | |
|---|---|---|---|---|---|---|
| | | Rare earth element | Ca | Mg | Be | Pb |
| Example | | | | | | |
| 1 | balance | La:80, Ce:5, Pr:5 | 1 | 1 | | |
| 2 | " | La:30 | 10 | 5 | | |
| 3 | " | La:1 | 20 | 10 | | |
| 4 | " | Ce:30 | 10 | 5 | | |
| 5 | " | Ce:90 | 15 | 10 | | |
| 6 | " | Pr:30 | 10 | 5 | | |
| 7 | " | Pr:90 | 5 | 10 | | |
| Comparative example | | | | | | |
| 8 | " | | 20 | 10 | | |
| 9 | " | La:100 | 10 | 5 | 10 | 30 |
| 10 | " | La:60 | 25 | 15 | | |
| 11 | " | La:90, Co:50 | | | 10 | 30 |

Results for the measurement of mechanical properties and bonding properties for the above-mentioned specimens are shown in the following Table (4).

TABLE 4

| Specimen No. | | Mechanical property | | | | Bonding test | | | |
|---|---|---|---|---|---|---|---|---|---|
| | | Normal temperature | | High temperature (250° C. 20S) | | | Tensile strength (g) | Neck strength (g) | Loop height (μm) | sweep (%) |
| | | B.L(g) | El (%) | B.L(g) | El (%) | Ball shape | | | | |
| Example | 1 | 10.8 | 4.0 | 8.3 | 2.2 | Excellent | 7.1 | 7.7 | 196 | 2.0 |
| | 2 | 13.3 | " | 9.8 | 2.4 | " | 9.5 | 10.3 | 210 | 1.9 |
| | 3 | 12.0 | " | 9.2 | 1.8 | " | 8.8 | 9.6 | 202 | 2.6 |
| | 4 | 11.8 | " | 8.9 | 2.1 | " | 8.3 | 8.9 | 209 | 2.1 |
| | 5 | 12.4 | " | 9.0 | 1.9 | " | 8.5 | 9.2 | 205 | 2.4 |
| | 6 | 11.7 | " | 8.9 | 2.0 | " | 8.2 | 9.0 | 208 | 2.0 |
| | 7 | 11.5 | " | 8.5 | 2.3 | " | 7.8 | 8.4 | 190 | 2.4 |
| Comparative | 8 | 12.1 | " | 9.1 | 1.8 | good | 8.4 | 9.6 | 177 | 5.0 |
| Example | 9 | 15.5 | " | 12.7 | 2.8 | poor | 10.6 | 11.8 | 186 | 5.5 |
| | 10 | 14.1 | " | 12.3 | 1.5 | " | 10.2 | 11.5 | 168 | 4.8 |
| | 11 | 12.6 | " | 10.1 | 2.0 | " | 8.0 | 9.1 | 189 | 3.7 |

From the results of the measurement, it can be seen that the composition of the present invention is best within the range described above.

The third embodiment for the Au wire according to the present invention comprises 30 to 200 wt ppm of La, 1 to 20 wt ppm of Be, 1 to 20 wt ppm of Ca, 1 to 60 wt ppm of one or more of platinum group elements and the balance of Au at high purity.

In the third embodiment, La, Be, Ca and platinum group element have the following functions.

La has a function of increasing tensile strength of the gold wire at high temperature (high temperature strength), promoting refining of crystal grains upon forming a ball, suppressing sweep in a long loop and suppressing wire flow upon resin molding. If the content is less than 30 wt ppm, the foregoing functions can not be satisfied.

On the contrary, if the La content exceeds 200 wt ppm, joining strength after bonding is reduced, as well as the ball hardness is increased to cause chip cracking upon bonding.

Be has a function of increasing tensile strength of the gold wire under normal temperature, as well as refining the crystal grain size upon ball-formation of the gold wire and suppressing sweep in a long loop like that for La. If the content is less than 1 wt ppm, no desired function can be obtained.

On the other hand, if the Be content exceeds 20 wt ppm, joining strength is reduced, and neck disconnection or chip cracking is caused upon bonding.

Ca has a function of particularly improving high temperature strength of the gold wire, increasing tensile strength at normal temperature, suppressing aging change, as well as promoting refining of crystal grains upon ball formation and suppressing wire flow upon resin molding. If the content is less than 1 wt ppm, the foregoing functions can not be obtained.

On the contrary, if the Ca content exceeds 20 wt ppm, joining strength is reduced, neck disconnection or chip cracking is caused and abnormality in the shape of the loop, such as sagging, may frequently occur.

The platinum group elements comprise Pt, Ir, Pd, Rh, etc. and they have a function, in cooperation with La, Be and Ca, of suppressing wire bonding, particularly, in a long loop. If the content is less than 1 wt ppm, the functions can not be satisfied. On the other hand, if it exceeds 60 wt ppm, joining strength is reduced, and neck disconnection or chip cracking is caused.

Explanation will be made for the examples of the third embodiment, as follows:

Each of the specimens was prepared by melting and casting high purity Au (99.999%) with addition of La, Be, Ca and one or more of Pt and Pd among the platinum group elements, applying fabrication with grooved roll, in which annealing was applied in the course of the fabrication, and then applying wire drawing to form an extremely fine gold wire of 25 μmφ.

The contents of elements in each of the specimens are as shown in Table 5. Specimens Nos. 1-7 are examples of the present invention, while specimens Nos. 8-12 are comparative examples out of the range of the composition according to the present invention.

TABLE 5

| Specimen No. | Au | Additive element (wt ppm) | | | | |
|---|---|---|---|---|---|---|
| | | Platinum group element | La | Be | Ca | Pb |
| Example | | | | | | |
| 1 | balance | Pt:60 | 30 | 1 | 1 | |
| 2 | " | Pt:30 | 100 | 10 | 10 | |
| 3 | " | Pt:1 | 150 | 10 | 10 | |
| 4 | " | Pt:60 | 200 | 20 | 20 | |
| 5 | " | Pt:30 Pd:30 | 100 | 10 | 10 | |
| 6 | " | Pd:1 | 150 | 20 | 10 | |
| 7 | " | Pd:60 | 200 | 10 | 15 | Comparative |
| example | | | | | | |
| 8 | " | — | 200 | 20 | 20 | |
| 9 | " | Pt:70 | 100 | 10 | 10 | |
| 10 | " | Pt:60 | 210 | 25 | 25 | |
| 11 | " | Pt:60 | — | — | | 30 |
| 12 | " | | 30 | 10 | 7 | 30 |

Results for the measurement of mechanical properties and bonding properties for the above-mentioned specimens are shown in the following Table 6.

TABLE 6

| Specimen No. | | Mechanical property | | | | Bonding test | | | |
|---|---|---|---|---|---|---|---|---|---|
| | | Normal temperature | | High temperature (250° C. 20S) | | | Tensile strength (g) | Neck strength (g) | Loop height (μm) | sweep (%) |
| | | B.L(g) | El (%) | B.L(g) | El (%) | Ball shape | | | | |
| Example | 1 | 11.0 | 4.0 | 8.0 | 2.5 | excellent | 7.3 | 7.8 | 220 | 2.2 |
| | 2 | 12.5 | " | 8.5 | 2.2 | " | 8.2 | 9.3 | 217 | 2.3 |
| | 3 | 12.7 | " | 8.8 | 1.8 | " | 8.5 | 9.5 | 200 | 2.5 |
| | 4 | 13.9 | " | 9.7 | 2.5 | " | 9.6 | 11.1 | 237 | 2.0 |
| | 5 | 13.2 | " | 8.4 | 2.3 | " | 9.3 | 10.0 | 225 | 1.9 |

TABLE 6-continued

| Specimen No. | | Mechanical property | | | | Bonding test | | | |
|---|---|---|---|---|---|---|---|---|---|
| | | Normal temperature | | High temperature (250° C. 20S) | | Tensile strength (g) | Neck strength (g) | Loop height (μm) | sweep (%) |
| | | B.L(g) | El (%) | B.L(g) | El (%) | Ball shape | | | |
| Comparative example | 6 | 13.0 | " | 8.8 | 1.9 | " | 9.0 | 9.9 | 201 | 2.5 |
| | 7 | 13.4 | " | 9.2 | 2.5 | " | 9.3 | 10.5 | 230 | 2.2 |
| | 8 | 13.5 | " | 10.8 | 1.5 | " | 10.2 | 10.7 | 189 | 3.4 |
| | 9 | 13.3 | " | 9.0 | 2.9 | " | 9.2 | 10.1 | 196 | 4.7 |
| | 10 | 15.0 | " | 11.7 | 2.0 | poor | 11.0 | 12.0 | 195 | 6.3 |
| | 11 | 9.6 | " | 7.3 | 2.7 | excellent | 6.0 | 6.7 | 207 | 3.0 |
| | 12 | 11.4 | " | 8.2 | 1.6 | " | 7.9 | 8.7 | 174 | 3.8 |

From the results of the measurement, it can be seen that the composition of the present invention is best within the range described above.

The fourth embodiment for the Au wire according to the present invention comprises from 30 to 100 wt ppm of La, 0.5 to 30 wt ppm of Be, 1 to 20 wt ppm of Ca, 0.5 to 50 wt ppm of Mg, 2 to 80 wt ppm of Ag, 0.5 to 50 wt ppm of Fe and the balance of Au at high purity.

In the fourth embodiment La, Be, Ca, Mg, Ag and Fe have the following functions.

La has a function of increasing tensile strength of the gold wire at high temperature (high temperature strength), promoting crystal refining upon forming a ball, suppressing sweep in a long loop and suppressing wire flow upon resin molding. If the content is less than 30 wt ppm, the foregoing functions can not be satisfied.

On the contrary, if the La content exceeds 100 wt ppm, joining strength after bonding is reduced, and ball hardness is increased to cause chip cracking upon bonding.

Be has a function of increasing tensile strength of the gold wire under normal temperature, as well as refining the crystal grain size upon ball-formation of the gold wire and suppressing sweep in a long loop like that for La. If the content is less than 0.5 wt ppm, no desired functions can be obtained.

On the other hand, if the Be content exceeds 30 wt ppm, joining strength is reduced, neck disconnection or chip cracking is caused upon bonding.

Ca has a function of particularly improving high temperature strength of the gold wire, increasing tensile strength at normal temperature, suppressing aging change, as well as promoting refining of crystal grains upon ball formation and suppressing wire flow upon resin molding. If the content is less than 1 wt ppm, the foregoing functions can not be obtained.

On the contrary, if Ca content exceeds 20 wt ppm, joining strength is reduced, neck disconnection or chip cracking is caused and abnormality in the shape of the loop, such as sagging, may used frequently occur.

Mg has a function of improving tensile strength at normal temperature and improving high temperature strength of the gold wire, suppressing aging change, as well as suppressing sweep in a long loop and suppressing wire flow upon resin molding. If the content is less than 1 wt ppm, the foregoing functions can not be obtained.

If the Mg content exceeds 10 ppm, joining strength is reduced, ball shape (sphericalness) is not stable and chip cracking is caused upon bonding.

Ag has a function of improving tensile strength at high temperature and suppressing aging change of the gold wire, as well as suppressing sweep in a long loop. If the content is less than 2 wt ppm, the foregoing functions can not be obtained.

On the contrary, if the Ag content exceeds 80 wt ppm, joining strength is reduced.

Fe has a function of improving normal and high temperature tensile strength and suppressing aging change in the gold wire. If the content is less than 0.5 wt ppm, no required functions can be obtained. On the other hand, if it exceeds 50 wt ppm, joining strength is reduced, ball shape is not stable and abnormality of the loop shape and chip cracking are caused.

Explanation will be made for the examples of the fourth embodiment, as follows:

Each of the specimens was prepared by melting and casting high purity Au (99.999%) with addition of La, Be, Ca, Mg, applying fabrication by grooved roll, in which annealing was applied in the course of the fabrication, and then applying wire drawing to form an extremely fine gold wire of 25 μmφ.

The contents of elements in each of the specimens are as shown in Table 7. Specimens Nos. 1–4 are examples of the present invention, while specimens Nos. 5–9 are comparative examples out of the range of the composition according to the present invention.

TABLE 7

| Specimen No. | Au | Additive element (wt ppm) | | | | | | |
|---|---|---|---|---|---|---|---|---|
| | | La | Be | Ca | Mg | Ag | Fe | Pb |
| Example | | | | | | | | |
| 1 | balance | 30 | 0.5 | 1 | 0.5 | 2 | 0.5 | |
| 2 | " | 50 | 15 | 10 | 25 | 40 | 25 | |
| 3 | " | 100 | 30 | 20 | 50 | 80 | 50 | |
| 4 | " | 100 | 1 | 3 | 5 | 5 | 5 | |
| Comparative example | | | | | | | | |
| 5 | " | 10 | 20 | | 60 | 90 | 20 | |
| 6 | " | 110 | 0.2 | 1 | 0.5 | 2 | 0.5 | |
| 7 | " | 20 | 30 | 20 | 50 | 80 | 50 | |
| 8 | " | — | 30 | 20 | 25 | 40 | 25 | |
| 9 | " | 30 | 10 | 7 | | | | 30 |

Results for the measurement of mechanical properties and bonding properties for the above-mentioned specimens are shown in the following Table 8.

TABLE 8

| Specimen No. | | Mechanical property | | | | Bonding test | | | |
|---|---|---|---|---|---|---|---|---|---|
| | | Normal temperature | | High temperature (250° C. 20S) | | Tensile strength (g) | Neck strength (g) | Loop height (μm) | sweep (%) |
| | | B.L(g) | El (%) | B.L(g) | El (%) | Ball shape | | | |
| Example | 1 | 11.5 | 4.3 | 6.8 | 4.7 | excellent | 7.0 | 8.3 | 226 | 1.9 |

TABLE 8-continued

| Specimen No. | | Mechanical property | | | | Bonding test | | | |
|---|---|---|---|---|---|---|---|---|---|
| | | Normal temperature | | High temperature (250° C. 20S) | | Tensile strength | Neck strength | Loop height | sweep |
| | | B.L(g) | El (%) | B.L(g) | El (%) | Ball shape | (g) | (g) | (μm) | (%) |
| | 2 | 15.2 | 4.1 | 10.4 | 3.2 | " | 9.2 | 12.6 | 202 | 2.3 |
| | 3 | 17.3 | 4.0 | 13.6 | 2.7 | " | 9.7 | 14.2 | 200 | 2.5 |
| | 4 | 11.8 | 4.2 | 8.7 | 3.8 | " | 8.1 | 9.5 | 214 | 2.1 |
| Comparative | 5 | 11.3 | 4.4 | 6.0 | 4.8 | " | 6.3 | 7.8 | 175 | 2.8 |
| example | 6 | 11.0 | 4.2 | 6.5 | 4.1 | " | 6.0 | 7.5 | 187 | 2.6 |
| | 7 | 15.9 | 4.1 | 11.5 | 2.8 | " | 8.9 | 13.0 | 190 | 3.2 |
| | 8 | 13.5 | 4.0 | 8.1 | 3.0 | " | 7.7 | 10.3 | 170 | 2.5 |
| | 9 | 11.0 | 4.0 | 8.1 | 1.1 | " | 8.0 | 8.6 | 188 | 2.7 |

From the results of the measurement, it can be seen that the composition of the present invention is best within the range described above.

According to the first–fourth embodiments aspects described above, the crystal grain size in the ball neck portion upon bonding is refined to improve the neck strength, mechanical strength is improved and the bonding properties can be improved even in a loop form of large loop height and large loop length, and it is possible to provide a semiconductor device of high reliability along with the tendency of employing multi-pin arrangement.

What is claimed is:

1. A gold wire used for the bonding of a semiconductor device, 30 to 100 wt ppm of La, 2 to 10 wt ppm of Be, 1 to 20 wt ppm of Ca, 1 to 10 wt ppm of Mg and the balance of Au at high purity.

2. A gold wire used for the bonding of a semiconductor device, comprising 1 to 20 wt ppm of Ca, 1 to 10 wt ppm of Mg, 1 to 90 wt ppm of one or more of rare earth elements and the balance of Au at high purity.

3. A gold wire used for bonding as defined in claim 2, wherein the rare earth element comprises one or more of La, Ce and Pr.

4. A gold wire used for the bonding of a semiconductor device, comprising 30 to 200 wt ppm of La, 1 to 20 wt ppm of Be, 1 to 20 wt ppm of Ca, 1 to 60 wt ppm of one or more of platinum group element and the balance of Au at high purity.

5. A gold wire used for bonding as defined in claim 4, wherein the platinum group element comprises one or more of Pt and Pd.

6. A gold wire used for the bonding of a semiconductor device, comprising 30 to 100 wt ppm of La, 0.5 to 30 wt ppm of Be, 1 to 20 wt ppm of Ca, 0.5 to 50 ppm of Mg, 2 to 80 wt ppm of Ag, 0.5 to 50 wt ppm of Fe and the balance of Au at high purity.

* * * * *

UNITED STATES PATENT AND TRADEMARK OFFICE
CERTIFICATE OF CORRECTION

PATENT NO. : 4,938,923
DATED : July 3, 1990
INVENTOR(S) : Takeshi KUJIRAOKA et al.

It is certified that error appears in the above-indentified patent and that said Letters Patent is hereby corrected as shown below:

At column 1, line 57, change "." to ---,--- after "Ca".
At column 4, line 11, change "earth!element" to ---earth element---.
At column 7, line 41, insert ---and--- before "neck".
At column 7, line 53, delete "used".
At column 9, line 18, delete "aspects".
At column 9, line 29, (claim 1, line 2), insert ---comprising--- before "30".

Signed and Sealed this

Twenty-eight Day of February, 1995

Attest:

BRUCE LEHMAN

*Attesting Officer*  *Commissioner of Patents and Trademarks*